(12) United States Patent
Todorov et al.

(10) Patent No.: US 10,957,937 B2
(45) Date of Patent: Mar. 23, 2021

(54) THREE-TERMINAL COPPER-DRIVEN NEUROMORPHIC DEVICE

(71) Applicant: International Business Machines Corporation, Armonk, NY (US)

(72) Inventors: Teodor K. Todorov, Yorktown Heights, NY (US); Takashi Ando, Tuckahoe, NY (US); Vijay Narayanan, New York, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 16/295,986

(22) Filed: Mar. 7, 2019

(65) Prior Publication Data

US 2020/0287236 A1  Sep. 10, 2020

(51) Int. Cl.
| | | |
|---|---|---|
| H01M 10/0562 | (2010.01) | |
| H01G 11/56 | (2013.01) | |
| H01L 45/00 | (2006.01) | |
| H01M 4/58 | (2010.01) | |
| H01M 10/0525 | (2010.01) | |

(52) U.S. Cl.
CPC ........ *H01M 10/0562* (2013.01); *H01G 11/56* (2013.01); *H01L 45/085* (2013.01); *H01L 45/1206* (2013.01); *H01L 45/1266* (2013.01); *H01M 4/581* (2013.01); *H01M 10/0525* (2013.01)

(58) Field of Classification Search
CPC ............... H01L 45/085; H01L 45/1206; H01L 45/1266
See application file for complete search history.

(56) References Cited

U.S. PATENT DOCUMENTS

| | | |
|---|---|---|
| 4,789,610 A | 12/1988 | Kondo et al. |
| 4,810,599 A | 3/1989 | Kondo et al. |
| 4,965,151 A | 10/1990 | Takada et al. |
| 5,190,695 A | 3/1993 | Sotomura |
| 5,589,296 A | 12/1996 | Iwamoto et al. |
| 7,674,700 B2 | 3/2010 | Lee |

(Continued)

FOREIGN PATENT DOCUMENTS

CN     107425114 A     12/2017

OTHER PUBLICATIONS

Alberto Schiraldi et al., "Thermoelectric Power of the Solid Electrolyte Cu16Rb4I7Cl13," Zeitschrift für Physikalische Chemie, 135 (135):217-226, May 1983.

(Continued)

*Primary Examiner* — Allison Bernstein
(74) *Attorney, Agent, or Firm* — Randall Bluestone; Michael J. Chang, LLC

(57) ABSTRACT

Three-terminal solid state Cu-ion actuated analog switching devices are provided. In one aspect, a method of forming a switching device includes: depositing a channel layer on a substrate; forming a source contact and a drain contact on opposite ends of the channel layer; forming a solid electrolyte on the channel layer over the source contact and the drain contact; and depositing a gate onto the solid electrolyte, wherein the source contact, the drain contact, and the gate are three terminals of the switching device. A switching device and a method of operating a switching device are also provided.

18 Claims, 4 Drawing Sheets

(56) References Cited

U.S. PATENT DOCUMENTS

| | | | |
|---|---|---|---|
| 9,224,946 B2 | 12/2015 | Kim et al. | |
| 10,033,379 B2 | 7/2018 | Kurokawa et al. | |
| 10,429,343 B1* | 10/2019 | Talin | H01L 45/1266 |
| 2003/0118897 A1 | 6/2003 | Mino et al. | |
| 2017/0275172 A1 | 9/2017 | Zhao et al. | |
| 2018/0138199 A1 | 5/2018 | Kim et al. | |

OTHER PUBLICATIONS

Fuller et al., "Li-ion synaptic transistor for low power analog computing," Advanced Materials 2017, vol. 29, issue 4 (published Nov. 2016) (8 pages).

Arita et al., "Switching operation and degradation of resistive random access memory composed of tungsten oxide and copper investigated using in-situ TEM," Scientific Reports 5:17103 (Nov. 2015) (10 pages).

Xie et al., "Copper atomic-scale transistors," Beilstein J Nanotechnol 8:530-538 (Mar. 2017).

Takahashi et al., "Solid-State Ionics: High Copper Ion Conductivity of the System CuCl-CuI-RbCl," Journal of The Electrochemical Society, vol. 126, No. 10, 1979, pp. 1654-1658.

Chen et al., "A CMOS-compatible electronic synapse device based on Cu/SiO2/W programmable metallization cells," Nanotechnology, vol. 27, No. 25, pp. 1-9 (May 2016).

Zhou et al., "Simple Fabrication of Molecular Circuits by Shadow Mask Evaporation," Nano Letters, vol. 3, No. 10, pp. 1371-1374 (published Sep. 2003).

T.E. Warner, "Synthesis, Properties and Mineralogy of Important Inorganic Materials, Chapter 6, Rubidium Copper Iodide Chloride Rb4Cu16I7Cl13 by a Solid-State Reaction," John Wiley & Sons, Ltd., (Apr. 2011) (10 pages).

English Translation of CN107425114, dated Dec. 1, 2017 by Yang et al. (10 pages).

Kanno et al., "Rechargeable all solid-state cell with high copper ion conductor and copper chevrel phase," Materials Research Bulletin, vol. 22, Issue 9, Sep. 1987, Abstract (1 page).

Douglas O Raleigh, "Cathodic Instability in Solid Copper Ion Battery Electrolytes: A Suggested General Mechanism," Journal of The Electrochemical Society, vol. 123, No. 7. Jul. 1976, pp. 1063-1065.

Alberto Schiraldi et al., "Thermoelectric Power of the Solid Electrolyte Cu16Rb4I7Cl13," Zeitschrift für Physikalische Chemie, vol. 135, No. 135, 1983 (5 pages).

List of IBM Patents or Applications Treated as Related (2 pages).

Soga et al., "Preparation and electrical conductivity of thin films of Rb4Cu16I7Cl13," Journal of Applied Electrochemistry 12 (1982) 185-191 (Year: 1982).

Kuwabara et al., "Solid electrolyte cells with a copper ion conductor Rb4Cu16I7Cl13. IV. Mixed-phase cathodes containing metal oxides," Journal of Applied Electrochemistry 18 (1988) 705-709 (Year: 1988).

Geller et al., "Crystal structure and conductivity of the solid electrolyte α-RbCu4Cl3I2," Physical Review B, vol. 19, No. 10 (May 1979) 5396-5402 (Year 1979).

* cited by examiner

THREE-TERMINAL COPPER-DRIVEN NEUROMORPHIC DEVICE

FIELD OF THE INVENTION

The present invention relates to neuromorphic devices, and more particularly, to three-terminal solid state copper (Cu)-ion actuated analog switching devices.

BACKGROUND OF THE INVENTION

Lithium intercalation materials (for example lithium cobalt oxide ($LiCoO_2$)) exhibiting resistivity change as a function of lithium (Li) content have been proposed for neuromorphic and analog computing applications such as synaptic transistors. See, for example, Fuller et al., "Li-ion synaptic transistor for low power analog computing," Advanced Materials 2017, volume 29, issue 4 (published November 2016) (8 pages). However, lithium compounds are both water and air-sensitive. Lithium compounds are also not readily compatible with standard microfabrication procedures.

The high conductivity and manufacturing compatibility of copper (Cu) makes it attractive as a switching material. For instance, Cu has been demonstrated in two-terminal resistive random access memory (ReRAM) devices. See, for example, Arita et al., "Switching operation and degradation of resistive random access memory composed of tungsten oxide and copper investigated using in-situ TEM," Scientific Reports 5:17103 (November 2015) (10 pages). Three-terminal copper-based transistors with liquid electrolyte have also shown reliable switching. See, for example, Xie et al., "Copper atomic-scale transistors," Beilstein J Nanotechnol 8:530-538 (March 2017).

Highly conductive solid state Cu ion electrolytes of the Cu—Rb—I—Cl system such as $Cu_{16}Rb_4I_7Cl_{13}$ have been developed. See, for example, Takahashi et al., "Solid-State Ionics: High Copper Ion Conductivity of the System CuCl—CuI—RbCl," Journal of The Electrochemical Society, Vol. 126, No. 10, 1979, pp. 1654-1658 (hereinafter "Takahashi"). Bulk synthesis of these solid state Cu electrolytes has been used for battery applications.

Complementary metal-oxide semiconductor (CMOS)-compatible electronic synapse devices based on $Cu/SiO_2/W$ programmable metallization cells have been reported. See, for example, Chen et al., "A CMOS-compatible electronic synapse device based on $Cu/SiO_2/W$ programmable metallization cells," Nanotechnology, vol. 27, no. 25, pp. 1-9 (May 2016). However, in two-terminal configurations writing and reading signals are not decoupled, thus leading to reliability issues such as read disturbance.

Thus, there is a need in the art for solid state Cu-based devices capable of reversible multilevel switching.

SUMMARY OF THE INVENTION

The present invention provides three-terminal solid state copper (Cu)-ion actuated analog switching devices. In one aspect of the invention, a method of forming a switching device is provided. The method includes: depositing a channel layer on a substrate; forming a source contact and a drain contact on opposite ends of the channel layer; forming a solid electrolyte on the channel layer over the source contact and the drain contact; and depositing a gate onto the solid electrolyte, wherein the source contact, the drain contact, and the gate are three terminals of the switching device.

The solid electrolyte can include a Cu-based ionic conductor having a formula $Cu_xA_yB_z$, wherein A is selected from: rubidium (Rb), caesium (Cs), potassium (K), sodium (Na) and/or lithium (Li), wherein B is selected from: fluorine (F), chlorine (Cl), bromine (Br) and/or iodine (I), and wherein $0<x<20$, $0<y<10$, and $0<z<30$. For instance, the solid electrolyte can include a rubidium copper iodide chloride material having a formula $Rb_4Cu_{16}I_7Cl_{13}$.

In another aspect of the invention, a switching device is provided. The switching device includes: a channel layer disposed on a substrate; a source contact and a drain contact disposed on opposite ends of the channel layer; a solid electrolyte disposed on the channel layer over the source contact and the drain contact, wherein the solid electrolyte includes a Cu-based ionic conductor having a formula $Cu_xA_yB_z$, wherein A is selected from: Rb, Cs, K, Na and/or Li, wherein B is selected from: F, Cl, Br and/or I, and wherein $0<x<20$, $0<y<10$, and $0<z<30$; and a gate disposed on the solid electrolyte, wherein the gate includes Cu, and wherein the source contact, the drain contact, and the gate are three terminals of the switching device.

In yet another aspect of the invention, a method of operating a switching device is provided. The method includes: applying a voltage pulse to the switching device, wherein the switching device includes: a channel layer disposed on a substrate; a source contact and a drain contact disposed on opposite ends of the channel layer; a solid electrolyte disposed on the channel layer over the source contact and the drain contact; a gate disposed on the solid electrolyte, wherein the first voltage pulse causes ion transport from the gate through the solid electrolyte to the channel layer; and reading a resistance state of the switching device.

The solid electrolyte can include a Cu-based ionic conductor having a formula $Cu_xA_yB_z$, wherein A is selected from: Rb, Cs, K, Na and/or Li, wherein B is selected from: F, Cl, Br and/or I, and wherein $0<x<20$, $0<y<10$, and $0<z<30$. The gate can include Cu, and the ions can include Cu ions (Cu+).

A more complete understanding of the present invention, as well as further features and advantages of the present invention, will be obtained by reference to the following detailed description and drawings.

DETAILED DESCRIPTION OF PREFERRED EMBODIMENTS

Provided herein are three-terminal, copper (Cu)-ion actuated analog switching devices employing a solid electrolyte. Advantageously, the present switching devices offer high-speed switching benefits while, due to their three-terminal configuration which decouple read and write operations, mitigating drawbacks such as low resistance/read disturbance that are commonly associated with counterpart two-terminal designs.

Figure 1:
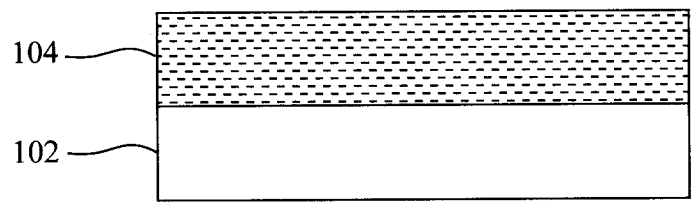
FIG. 1 is a cross-sectional diagram illustrating a (electrically conductive) channel layer having been deposited onto a substrate according to an embodiment of the present invention.

An exemplary methodology for forming the present analog switching devices is now described by way of reference to FIGS. 1-6. As shown in FIG. 1, the process begins with the deposition of a (electrically conductive) channel layer 104 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. For instance, according to an exemplary embodiment, substrate 102 is a Si-on-insulator wafer, wherein the SOI layer (i.e., Si) has a thickness of from about 500 angstroms (Å) to about 700 Å and ranges therebetween, e.g., about 550 Å.

Channel layer 104 provides a base onto which the solid electrolyte can be deposited (see below). Suitable materials for the channel layer 104 include, but are not limited to, metal nitrides such as tantalum nitride (TaN) and/or titanium nitride (TiN). By way of example only, the channel layer 104 can be deposited onto the substrate 102 using a process such as chemical vapor deposition (CVD), atomic layer deposition (ALD), physical vapor deposition (PVD), evaporation, sputtering, etc. According to an exemplary embodiment, the channel layer 104 is deposited onto the substrate 102 to a thickness of from about 10 Å to about 50 Å and ranges therebetween. For instance, according to one exemplary embodiment, the channel layer 104 is formed from TaN having a thickness of, e.g., about 30 Å.

Next, a source contact 202 and a drain contact 204 are formed on opposite ends of the channel layer 104. See FIG. 2. Suitable materials for the source contact 202 and the drain contact 204 include, but are not limited to, contact metals such as gold (Au), silver (Ag), platinum (Pt), palladium (Pd), nickel (Ni) and/or copper (Cu).

Figure 2:
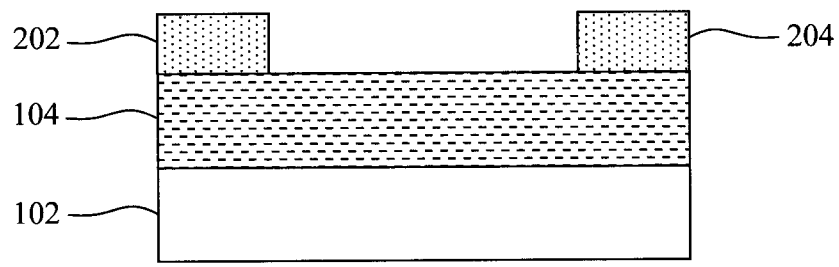
FIG. 2 is a cross-sectional diagram illustrating a source contact and a drain contact having been formed on opposite ends of the channel layer according to an embodiment of the present invention.
Figure 3:
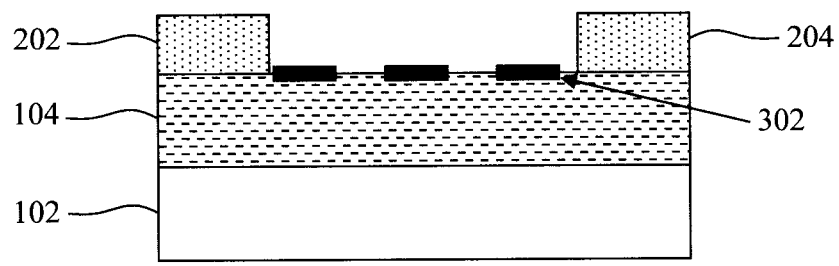
FIG. 3 is a cross-sectional diagram illustrating an optional metal seed layer having been deposited onto the channel layer in between the source contact and the drain contact according to an embodiment of the present invention.
Figure 4:
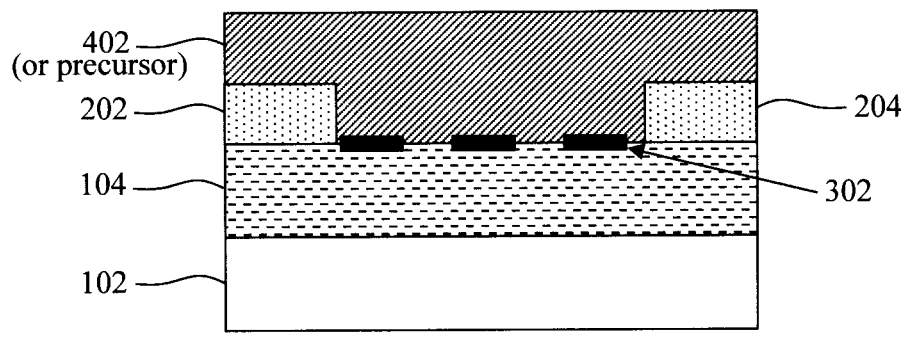
FIG. 4 is a cross-sectional diagram illustrating a solid electrolyte having been formed on the channel layer over the source contact and the drain contact and (optional) metal seed layer according to an embodiment of the present invention.
Figure 5:
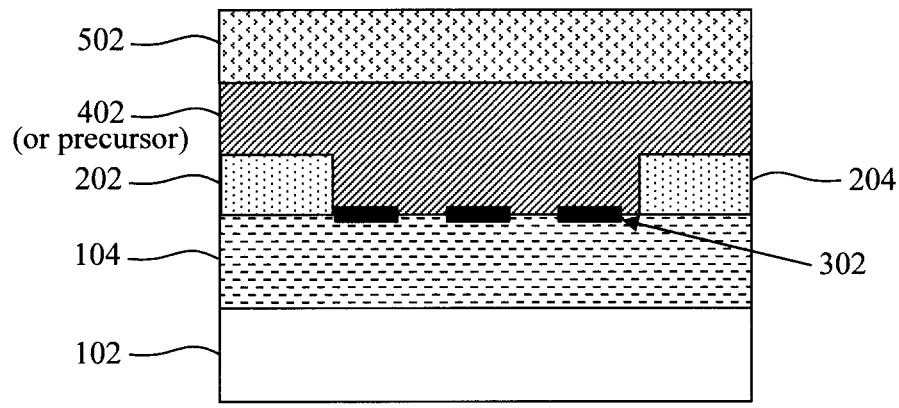
FIG. 5 is a cross-sectional diagram illustrating a gate having been deposited on the solid electrolyte according to an embodiment of the present invention.

According to an exemplary embodiment, the source contact 202 and the drain contact 204 are formed using an evaporation process such as electron-beam (e-beam) evaporation. Advantageously, the evaporation can be performed through a mask to form the source contact 202 and drain contact 204 on opposite ends of the channel layer 104 as shown in FIG. 2. See, for example, Zhou et al., "Simple Fabrication of Molecular Circuits by Shadow Mask Evaporation," Nano Letters, vol. 3, no. 10, pp. 1371-1374 (published September 2003), the contents of which are incorporated by reference as if fully set forth herein.

The source contact 202 and the drain contact 204 form two of the three terminals in the present three-terminal analog switching device. A gate over the solid electrolyte (see below) will form the third terminal.

Optionally, a metal seed layer 302 is next deposited onto the channel layer 104 in between the source contact 202 and the drain contact 204. See FIG. 3. The use of a metal seed layer helps facilitate plating/deplating of Cu ions during operation of the device (see below). Suitable materials for the metal seed layer 302 include, but are not limited to, Cu and at least one of Au and Pd. For instance, according to an exemplary embodiment, metal seed layer 302 is an alloy containing Cu and both Au and Pd, i.e., Au—Pd/Cu. The metal seed layer 302 can be deposited onto the channel layer 104 using a process such as evaporation. According to an exemplary embodiment, the metal seed layer 302 is formed as a thin (e.g., from about 1 nanometer (nm) to about 5 nm and ranges therebetween) continuous or non-continuous film on the exposed surface of the channel layer 104 in between the source contact 202 and the drain contact 204.

A solid electrolyte 402 is then formed on the channel layer 104 over the source contact 202 and the drain contact 204 and (optional) metal seed layer 302. See FIG. 4.

According to an exemplary embodiment, the solid electrolyte 402 is a Cu-based ionic conductor having the formula:

$$Cu_xA_yB_z,$$

wherein A is rubidium (Rb), caesium (Cs), potassium (K), sodium (Na) and/or lithium (Li), wherein B is fluorine (F), chlorine (Cl), bromine (Br) and/or iodine (I), and wherein $0<x<20$, $0<y<10$, and $0<z<30$. See, for example, U.S. patent application Ser. No. 16/296,027 by Todorov et al., entitled "Copper Ionic Conductor Film," (hereinafter "U.S. patent application Ser. No. 16/296,027"), the contents of which are incorporated by reference as if fully set forth herein. For instance, according to an exemplary embodiment, solid electrolyte 402 is a rubidium copper iodide chloride material having the formula $Rb_4Cu_{16}I_7Cl_{13}$.

As described in U.S. patent application Ser. No. 16/296,027, annealing the material at a temperature that is less than a melting point of the mixture (see below) results in the formation of a homogenous, crystalline ionic conductor which will serve as the solid electrolyte 402. Advantageously, the solid electrolyte 402 formed from this homogenous, crystalline ionic conductor has an ionic conductivity of greater than about 0.34 Siemens per centimeter (S/cm), e.g., from about 0.34 S/cm to about 1 S/cm and ranges therebetween.

According to an exemplary embodiment, solid electrolyte 402 is deposited onto the channel layer 104 using vacuum evaporation. For instance, as provided in U.S. patent application Ser. No. 16/296,027, a Cu-based ionic conductor material such as rubidium copper iodide chloride, can be formed by combining constituent components of the material (for example, i) Cu, ii) a component A selected from: Rb, Cs, K, Na and/or Li, and iii) a component B selected from: F, Cl, Br and/or I) to form a blend of the constituent components, melting the blend (e.g., at a temperature of from about 200° C. to about 350° C. and ranges therebetween, for a duration of from about 1 minute to about 10 minutes and ranges therebetween), gradually cooling the blend back to room temperature to form a solid product; grinding the solid product into a powder; re-melting the powder to form a melted product, rapidly quenching the melted product (e.g., with a ramp-down rate of from about 50° C./second to about 100° C./second and ranges therebetween) to form the mixture of the constituent components, depositing the mixture of constituent components (e.g., using vacuum evaporation), and annealing the mixture (e.g., at a temperature that is less than a melting point of the mixture of the constituent components, for example, at a temperature of from about 50° C. to about 200° C. and ranges therebetween, for a duration of from about 10 minutes to about 15 minutes and ranges therebetween). By way of example only, in the case of a rubidium copper iodide chloride material having the formula $Rb_4Cu_{16}I_7Cl_{13}$, the constituent components can include copper chloride (CuCl), copper iodide (Cu) and/or rubidium chloride (RbCl).

The annealing of the deposited mixture (e.g., at a temperature that is less than a melting point of the mixture) is needed to complete formation of the solid electrolyte 402 as it provides a material having a homogenous, crystalline structure. This anneal can be performed at this point in the process or, as described in conjunction with the description of FIG. 6 below, after formation of the gate. In the latter case, the solid electrolyte 402 may at this stage also be referred to herein as a "precursor electrolyte" or simply "precursor" which will be subsequently converted to its final homogenous, crystalline form via the anneal to serve as solid electrolyte 402.

Next, a gate 502 is deposited on the solid electrolyte 402. See FIG. 5. Suitable materials for the gate 502 include, but are not limited to, metals such as Cu. Gate 502 can be deposited onto the solid electrolyte 402 using a process such as thermal evaporation. According to an exemplary embodiment, gate 502 is formed having a thickness of from about 10 Å to about 50 Å and ranges therebetween.

As provided above, the source contact 202 and the drain contact 204 form two of the three terminals in the present three-terminal analog switching device. Gate 502 forms the third terminal of the device.

Advantageously, when formed from Cu, gate 502 will serve both as a conductor and as a source of Cu ions (Cu+) for reading/writing purposes. Namely, as will be described in detail below, during operation the solid electrolyte 402 will serve as both a conductor and an insulator based on the process of voltage-driven ion transport/intercalation. For instance, in its as-fabricated state the solid electrolyte 402 serves as an insulator, and the potential between the source contact 202 and the drain contact 204 is about 0. However, applying a positive write voltage pulse to the gate 502 causes ions (e.g., Cu+) from the gate 502 to diffuse through the solid electrolyte 402 (to the channel layer 104) causing an electronic phase transition of the solid electrolyte 402 from an insulator to a conductor. A voltage pulse of the opposite polarity (e.g., a negative voltage pulse of the same magnitude) serves to return the solid electrolyte 402 to its as-fabricated, insulator state thereby permitting writing and re-writing operations to be performed.

Figure 6:
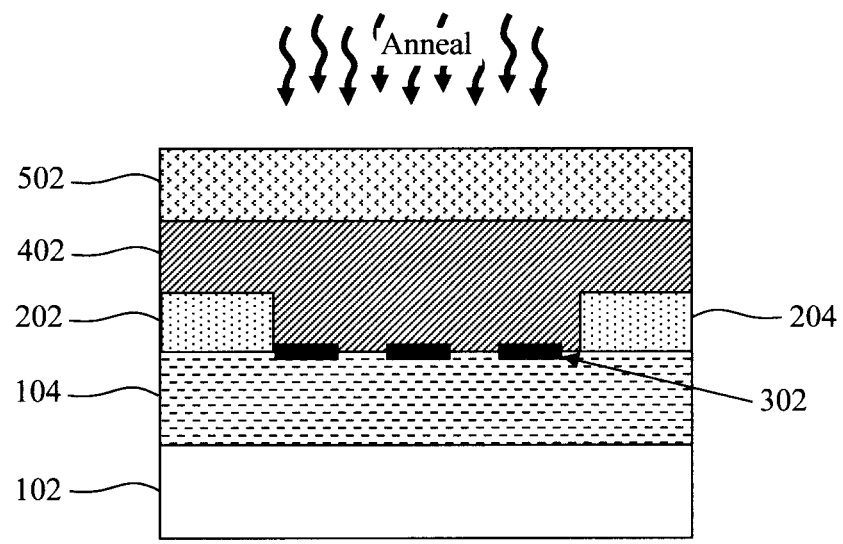
FIG. 6 is a cross-sectional diagram illustrating an anneal of the device being performed according to an embodiment of the present invention.

As show in FIG. 6, an anneal of the device is performed to convert the deposited mixture of "precursor electrolyte" components (see description of FIG. 4, above) into the final homogenous, crystalline form of solid electrolyte 402. As provided above, this anneal can instead be performed earlier in the process, i.e., prior to deposition of gate 502. Thus, if performed earlier, the anneal shown in FIG. 6 is not needed.

As provided above, this anneal is performed at a temperature that is less than a melting point of the mixture. For instance, according to an exemplary embodiment, the anneal is performed at a temperature of from about 50° C. to about 200° C. and ranges therebetween, for a duration of from about 10 minutes to about 15 minutes and ranges therebetween.

Figure 7:
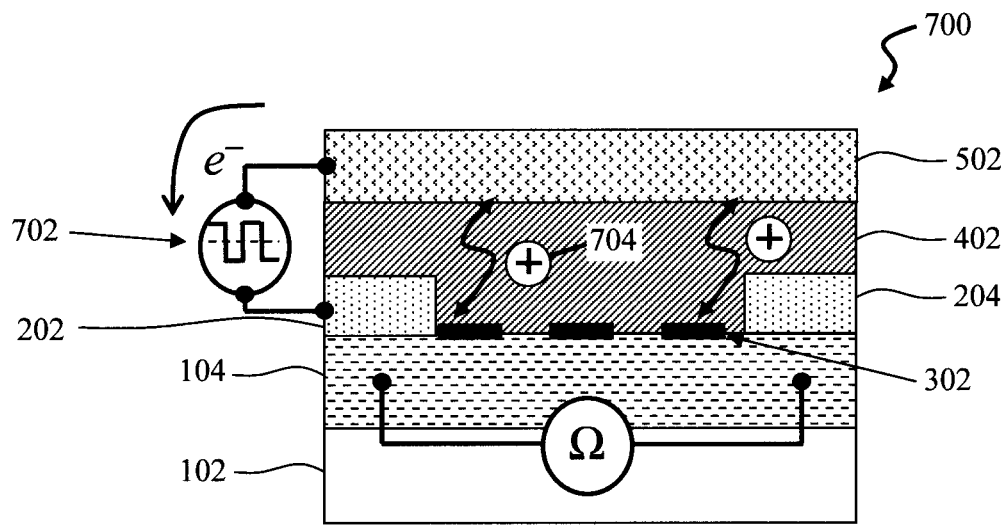
FIG. 7 is a cross-sectional diagram illustrating operation of the present switching devices according to an embodiment of the present invention.
Figure 8:
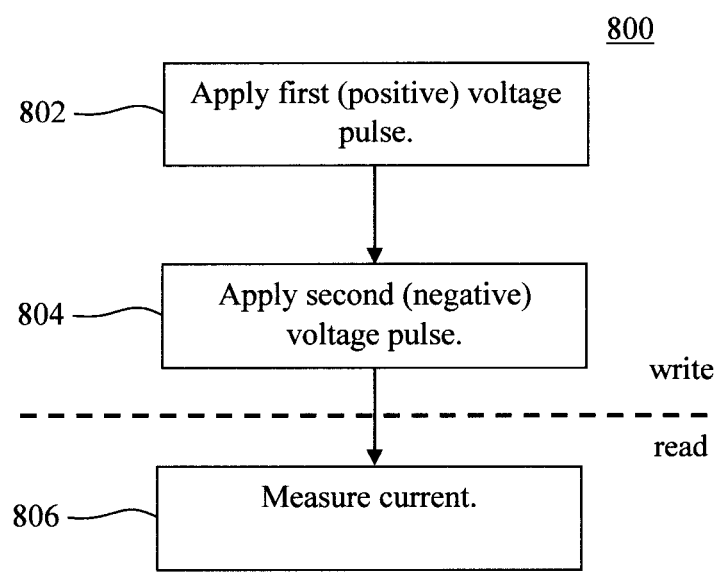
FIG. 8 is a diagram illustrating an exemplary methodology for operating the present switching devices according to an embodiment of the present invention.

Operation of the present Cu-ion actuated analog switching devices is now described by way of reference to device 700 of FIG. 7 and methodology 800 of FIG. 8. As provided above, solid electrolyte 402 is an ion-intercalated material that is configured to serve as both a conductor and an insulator based on a voltage-driven ion transport operation. In its as-fabricated state, the solid electrolyte 402 serves as an insulator, and the potential between the source contact 202 and the drain contact 204 is about 0. Resistance ($\Omega$) across the channel layer 104 is high (e.g., about 230 ohms ($\Omega$) (see below).

As provided above, gate 502 serves as a source of Cu+ ions. Thus, applying a first (positive) voltage pulse, e.g., of from about 0.01 volts (V) to about 0.05 V and ranges therebetween, for a duration of from about 800 seconds to about 1500 seconds and ranges therebetween, causes transport of Cu+ ions from the gate 502 through the solid electrolyte 402 to the channel layer 104. See, for example, FIG. 7 where a voltage pulse(s) 702 is applied to the source contact 202 and gate 502 which causes ions 704 (e.g., Cu+) from the gate 502 to move through the solid electrolyte 402 toward the channel layer 104/optional seed layer 302. See also step 802 of methodology 800 of FIG. 8. This action is what is also referred to above as "plating." Generally, during plating ions from an anode move through an electrolyte towards a cathode. Here, the applied voltage causes ions (e.g., Cu+ ions) from the gate 502 to move through solid electrolyte 402 towards the channel layer 104/optional seed layer 302.

Reversing the pulse reverses the flow of ions 704 back towards the gate 502. Namely, applying a second (negative) voltage pulse serves to return the Cu+ ions back to the gate 502, restoring the resistance $\Omega$ back to its original state (prior to application of the first pulse). See FIG. 7 which illustrates how ions 704 (e.g., Cu+) can be move to/from the gate 502 into/out from the solid electrolyte 402 based on the applied voltage pulse(s) 702. See also step 804 of methodology 800 of FIG. 8. According to an exemplary embodiment, the first (positive) and second (negative) pulses are of the same duration and magnitude. This action is what is also referred to above as "deplating," where reversing the applied voltage causes ions (e.g., Cu+ ions) to move back through solid electrolyte 402 towards the gate 502.

In step 806 of methodology 800 of FIG. 8, the resistance state of device 700 is read by applying a much smaller voltage pulse than is needed for ion transport (e.g., less than 0.01 V) and measuring the current. Higher current measurements at the lower-voltage "read" condition would correspond to a lower resistance state, and vice versa.

It is to be understood that the specific order and/or number of iterations of the steps performed in methodology 800 can vary depending on the particular operations being performed. For instance, variants include applying multiple first (positive) voltage pulses and/or multiple second (negative) voltage pulses, in any order and potentially of varying duration. Further, the resistance state of the device can be read after each pulse, if so desired.

Figure 9:
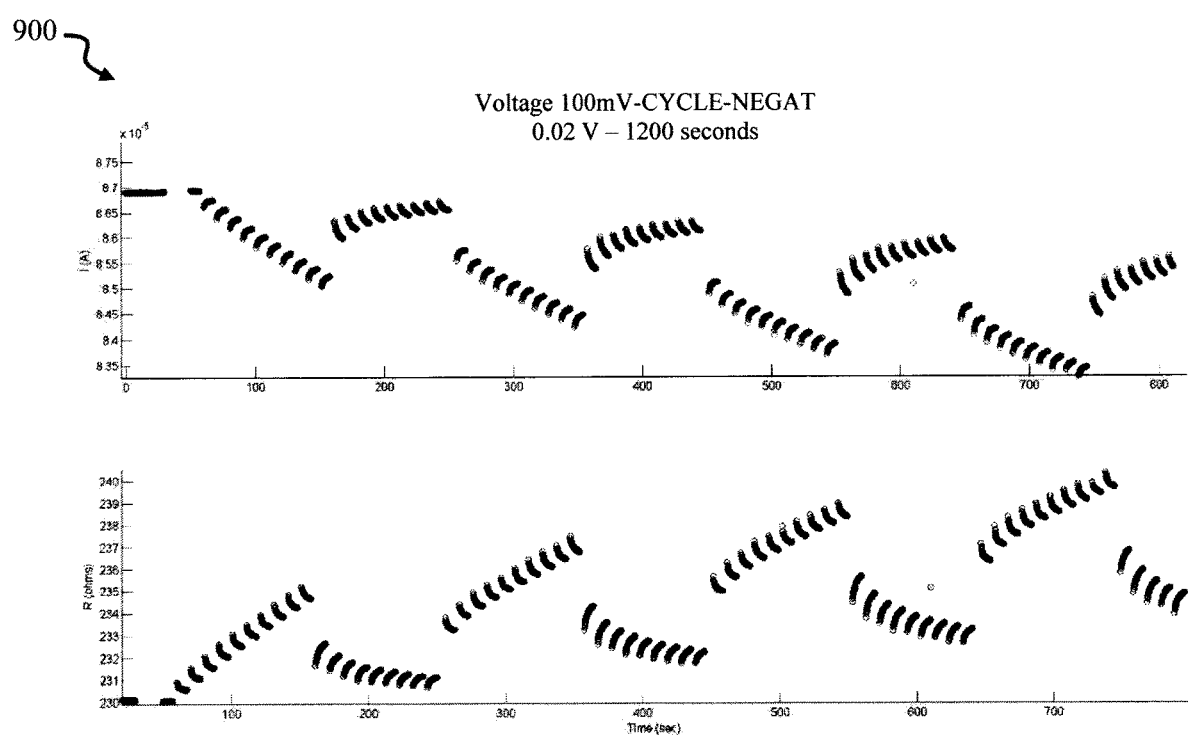
FIG. 9 is a diagram illustrating operating characteristics of the present switching devices according to an embodiment of the present invention.

FIG. 9 is a diagram 900 illustrating operating characteristics of the present Cu-ion actuated analog switching devices. In the top plot of diagram 900, switching current (I)

(measured in amps (A)) is plotted as a function of time (measured in seconds (sec). In the bottom plot of diagram 900 resistance (R) (measured in ohms) is plotted as a function of time. As shown in diagram 900, negative and positive voltage pulses (in the top plot) result in corresponding increases and decreases in resistance.

Advantageously, with the present Cu-ion actuated analog switching devices there is a constant potential at zero switching current. For instance, when tested with voltage pulses at about 100 millivolts (mV), e.g., 5 positive and 5 negative pulses, the potential in between is about 0. Thus, when data is not being written to the device, the potential is nearly 0 which is extremely efficient.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a switching device, the method comprising:
   depositing a channel layer on a substrate;
   forming a source contact and a drain contact on opposite ends of the channel layer;
   forming a solid electrolyte on the channel layer over the source contact and the drain contact; and
   depositing a gate onto the solid electrolyte, wherein the source contact, the drain contact, and the gate comprise three terminals of the switching device, and wherein the gate comprises Cu.

2. The method of claim 1, wherein the solid electrolyte comprises a copper (Cu)-based ionic conductor having a formula $Cu_xA_yB_z$, wherein A is selected from the group consisting of: rubidium (Rb), caesium (Cs), potassium (K), sodium (Na), lithium (Li) and combinations thereof, wherein B is selected from the group consisting of: fluorine (F), chlorine (Cl), bromine (Br), iodine (I) and combinations thereof, and wherein $0<x<20$, $0<y<10$, and $0<z<30$.

3. The method of claim 2, wherein the solid electrolyte comprises a rubidium copper iodide chloride material.

4. The method of claim 3, wherein the rubidium copper iodide chloride material has a formula $Rb_4Cu_{16}I_7Cl_{13}$.

5. The method of claim 2, wherein the solid electrolyte has an ionic conductivity of from about 0.34 Siemens per centimeter (S/cm) to about 1 S/cm and ranges therebetween.

6. The method of claim 1, wherein the channel layer comprises a material selected from the group consisting of: tantalum nitride (TaN), titanium nitride (TiN), and combinations thereof.

7. The method of claim 1, wherein the source contact and the drain contact comprise a metal selected from the group consisting of: gold (Au), silver (Ag), platinum (Pt), palladium (Pd), nickel (Ni), copper (Cu), and combinations thereof.

8. The method of claim 1, further comprising:
   depositing a metal seed layer onto the channel layer between the source contact and the drain contact.

9. The method of claim 8, wherein the metal seed layer comprises Cu and at least one of gold (Au) and palladium (Pd).

10. A switching device, comprising:
    a channel layer disposed on a substrate;
    a source contact and a drain contact disposed on opposite ends of the channel layer;
    a solid electrolyte disposed on the channel layer over the source contact and the drain contact, wherein the solid electrolyte comprises a Cu-based ionic conductor having a formula $Cu_xA_yB_z$, wherein A is selected from the group consisting of: Rb, Cs, K, Na, Li and combinations thereof, wherein B is selected from the group consisting of: F, Cl, Br, I and combinations thereof, and wherein $0<x<20$, $0<y<10$, and $0<z<30$; and
    a gate disposed on the solid electrolyte, wherein the gate comprises Cu, and wherein the source contact, the drain contact, and the gate comprise three terminals of the switching device.

11. The switching device of claim 10, wherein the solid electrolyte comprises a rubidium copper iodide chloride material having a formula $Rb_4Cu_{16}I_7Cl_{13}$.

12. The switching device of claim 10, wherein the solid electrolyte has an ionic conductivity of from about 0.34 S/cm to about 1 S/cm and ranges therebetween.

13. The switching device of claim 10, wherein the channel layer comprises a material selected from the group consisting of: TaN, TiN and combinations thereof.

14. The switching device of claim 10, further comprising:
    a metal seed layer disposed on the channel layer between the source contact and the drain contact.

15. The switching device of claim 14, wherein the metal seed layer comprises Cu and at least one of Au and Pd.

16. A method of operating a switching device, the method comprising:
    applying a voltage pulse to the switching device, wherein the switching device comprises:
        a channel layer disposed on a substrate;
        a source contact and a drain contact disposed on opposite ends of the channel layer;
        a solid electrolyte disposed on the channel layer over the source contact and the drain contact;
        a gate disposed on the solid electrolyte, wherein the first voltage pulse causes ion transport from the gate through the solid electrolyte to the channel layer, wherein the gate comprises Cu, and wherein the ions comprise Cu ions (Cu+); and
    reading a resistance state of the switching device.

17. The method of claim 16, wherein the solid electrolyte comprises a Cu-based ionic conductor having a formula $Cu_xA_yB_z$, wherein A is selected from the group consisting of: Rb, Cs, K, Na, Li and combinations thereof, wherein B is selected from the group consisting of: F, Cl, Br, I and combinations thereof, and wherein $0<x<20$, $0<y<10$, and $0<z<30$.

18. The method of claim 16, further comprising:
    applying a reverse voltage pulse to return the ions to the gate.

* * * * *